United States Patent [19]
Kono

[11] Patent Number: 5,335,348
[45] Date of Patent: Aug. 2, 1994

[54] RADIO RECEIVER HAVING FREQUENCY SWEEP CONTROL APPARATUS

[75] Inventor: Shinichi Kono, Tokyo, Japan

[73] Assignee: NEC Corporation, Japan

[21] Appl. No.: 998,397

[22] Filed: Dec. 29, 1992

[30] Foreign Application Priority Data

| Jan. 10, 1992 | [JP] | Japan | 4-021939 |
| Jan. 30, 1992 | [JP] | Japan | 4-040363 |
| Apr. 21, 1992 | [JP] | Japan | 4-126675 |
| Apr. 21, 1992 | [JP] | Japan | 4-126676 |
| Jun. 17, 1992 | [JP] | Japan | 4-157197 |

[51] Int. Cl.$^5$ .................................. H04B 1/16
[52] U.S. Cl. .................................. 455/192.2; 455/257
[58] Field of Search ............... 455/167.1, 182.2, 192.2, 455/196.1, 208, 209, 255, 256, 257, 258, 264, 265, 192.1, 259; 375/75, 97

[56] References Cited

U.S. PATENT DOCUMENTS

| 2,896,169 | 7/1959 | Howell | 455/265 |
| 4,004,233 | 1/1977 | Sakamoto | 455/182.2 |
| 4,152,650 | 5/1979 | Bennett, Jr. | 455/257 |
| 4,636,736 | 1/1987 | Woodworth et al. | 455/265 |
| 5,107,522 | 4/1992 | Kitayama et al. | 455/265 |

Primary Examiner—Reinhard J. Eisenzopf
Assistant Examiner—Nguyen Vo
Attorney, Agent, or Firm—Laff, Whitesel, Conte, Saret

[57] ABSTRACT

A frequency sweep control apparatus includes a variable frequency oscillator, a demodulator, a unique word signal detector, a sweep range controller, and a frequency controller. The variable frequency oscillator is capable of controlling an oscillation frequency. The demodulator demodulates a reception intermediate frequency signal by using an output from the variable frequency oscillator. The unique word signal detector detects a unique word signal in the reception signal from a demodulated output from the demodulator 102 and outputs a detection signal indicating a unique word signal detected state in which the unique word signal is detected or a unique word signal non-detected state in which the unique word signal is not detected. The sweep range controller controls a sweep range on the basis of an output from the unique word signal detector. The frequency controller controls the oscillation frequency of the variable frequency oscillator on the basis of an output from the sweep range controller.

12 Claims, 13 Drawing Sheets

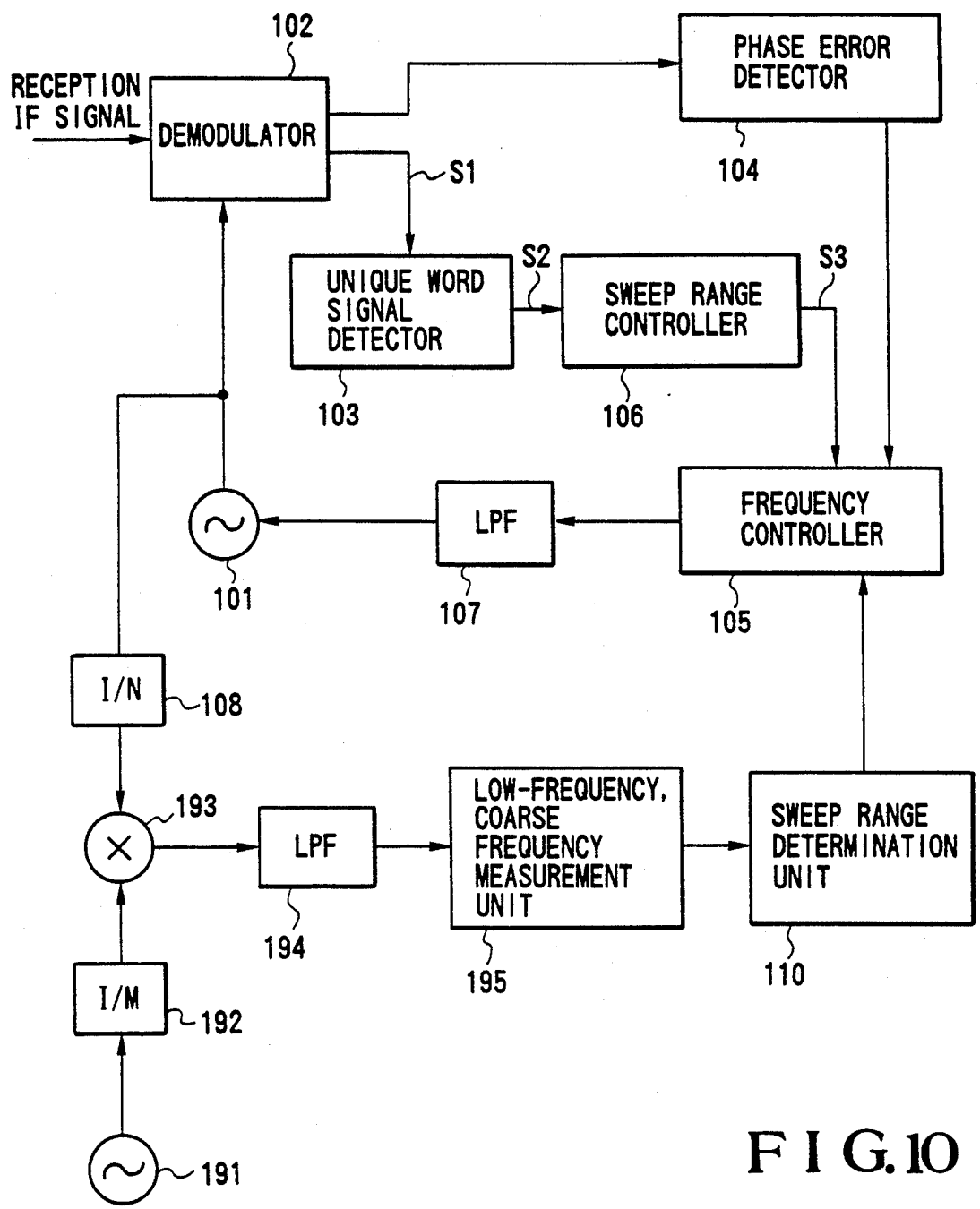
F I G. 10

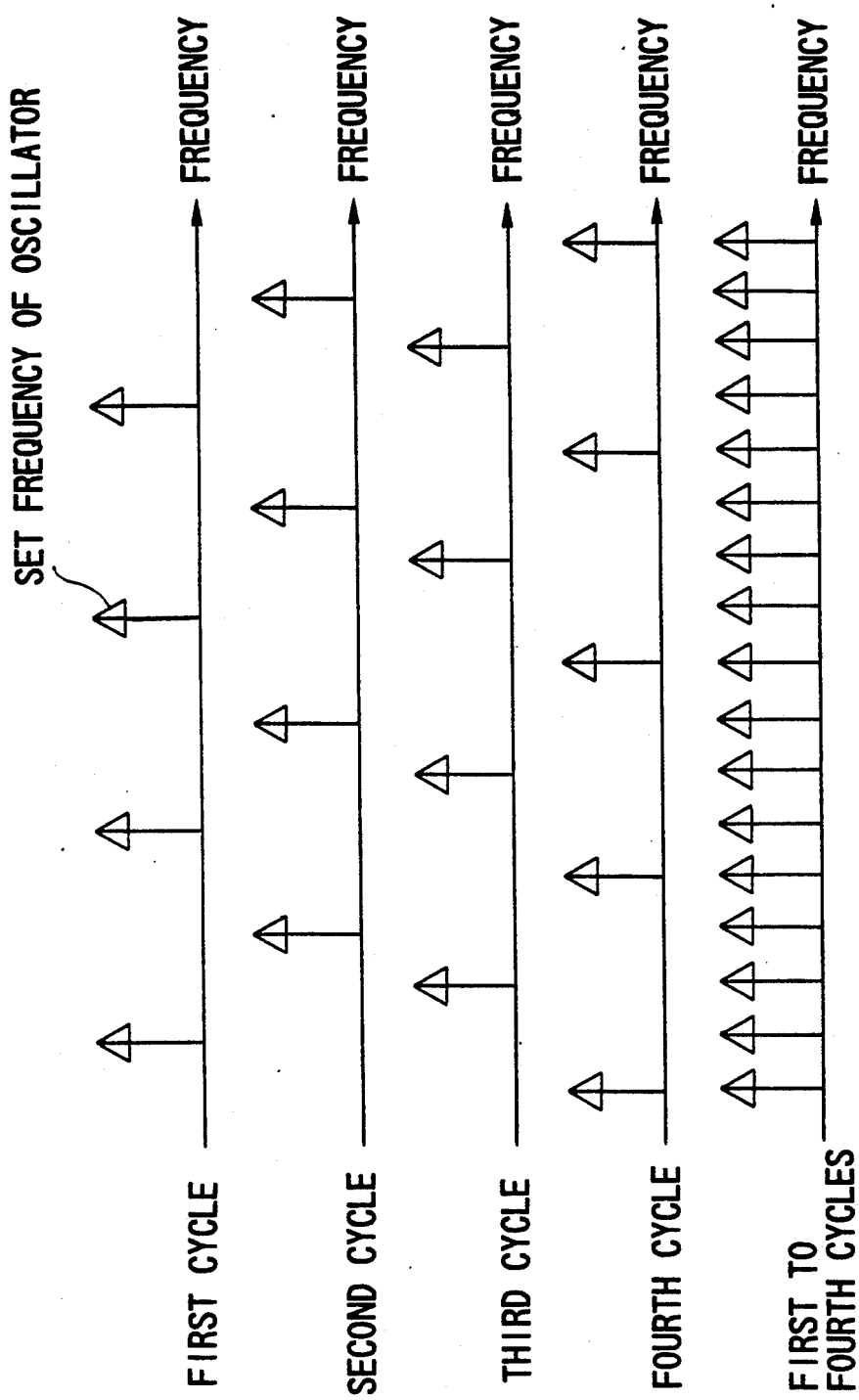

RADIO RECEIVER HAVING FREQUENCY SWEEP CONTROL APPARATUS

BACKGROUND OF THE INVENTION

The present invention relates to a frequency sweep control apparatus and, more particularly, to a frequency sweep control apparatus in a radio communication receiver used for satellite communications and the like, which apparatus is designed to demodulate an optimal reception signal while performing sweep control of a local oscillation frequency.

In a demodulation apparatus of this type, an AFC (Auto Frequency Control) operation conforming to variations in the frequency of a reception signal upon synchronization with the reception signal and a sweep operation to repeatedly sweep the variable frequency range of the reception signal until establishment of synchronization with the reception signal are selectively performed in accordance with synchronous and asynchronous states with respect to the reception signal.

In a demodulator, in order to demodulate a reception signal, the frequency of the reception signal and the frequency of an oscillator in the demodulator must be set to coincide with each other. The frequency of the reception signal, however, is shifted near a certain frequency (center frequency) due to a frequency deviation caused in a satellite as a repeater in satellite communications.

Especially in satellite communications, since the frequency in use is set on the order of GHz, even a small frequency variation causes a reception intermediate frequency to greatly shift from a true value when it is input to a demodulator. If the frequency in use is, for example, 12 GHz, a 1-ppm variation corresponds to a 12-kHz variation.

Sweep operations are performed while the frequency is gradually changed until the demodulator can demodulate the reception signal. Every time a sweep operation is performed, demodulation success/failure determination is performed. For example, demodulation success/failure determination is based on whether a unique word signal (or synchronization signal) detector detects a unique word signal. Methods of sweep include a reciprocal sweep method in which the frequency is alternately changed from the minimum value to the maximum value and from the maximum value to the minimum value, and a cyclic sweep method in which the frequency is repeatedly changed from the minimum value to the maximum value.

FIG. 1 shows a conventional frequency sweep control apparatus of this type. Referring to FIG. 1, reference numeral 1 denotes a variable frequency oscillator; 2, a demodulator for demodulating a reception IF (Intermediate Frequency) signal by using an output from the variable frequency oscillator 1, and outputting phase error information based on the difference between the reception IF signal and the frequency of the variable frequency oscillator 1; 3, a unique word signal detector 3 for detecting a unique word signal in a demodulated signal output from the demodulator 2; 4, a phase error detector for detecting a phase error from the phase error information output from the demodulator 2; and 5, a frequency controller for controlling the oscillation frequency of the variable frequency oscillator 1 on the basis of the outputs from the unique word signal detector 3 and the phase error detector 4. An LPF (low-pass filter) 7 is inserted in a control signal line of the frequency controller 5 so that a control voltage is output to the variable frequency oscillator 1 through the LPF 7. The time constant of the LPF 7 is fixed.

When a unique word signal is detected by the unique word signal detector 3, it is determined that synchronization is established. At this time, the oscillation frequency of the variable frequency oscillator 1 is controlled by a signal output from the phase error detector 4 through the frequency controller 5 and the LPF 7. This operation is an Auto Frequency Control (AFC) operation. If no unique word signal is detected by the unique word signal detector 3, asynchronization is determined. In this case, the frequency controller 5 performs control to sweep an output from the variable frequency oscillator 1. The reception IF signal is a modulated signal, e.g., a PSK-modulated signal. The demodulated signal is a two-component system constituted by an in-phase component and an orthogonal component.

Note that the unique word signal detector 3 is designed to output a signal indicating whether a unique word signal (unique word) contained in a reception signal is detected. When the unique word signal detector 3 detects a unique word signal, it means that the demodulator has properly demodulated the reception signal. That the demodulated reception signal is output means that all the synchronization required for a receiving operation, i.e., carrier synchronization, phase lock, clock synchronization, and bit synchronization, has been established. The frequency controller 5 is designed to control the frequency of the oscillator in the demodulator. The frequency controller 5 operates in both the sweep mode and the AFC mode. In the sweep mode, the oscillation frequency is changed stepwise. In the AFC mode, the oscillation frequency is continuously changed. Discrimination between a sweep state and an AFC state is dependent on an output from the unique word signal detector.

In the conventional frequency sweep control apparatus having such an arrangement, however, the sweep range of the reception system is defined by the sum of maximum frequency shifts in the overall apparatus, determined at the stage of system design, e.g., the maximum on the transmission side and the maximum frequency shift in a repeater, and the entire sweep range is always swept by the frequency controller 5 in the sweep mode. For this reason, even when a break occurs, e.g., when the currently used system is switched to a backup system on the transmission side, detection of a unique word signal cannot be performed on the reception side until one sweep cycle is completed to restore the oscillation frequency of the variable frequency oscillator 1 to the initial frequency. As a result, it takes much time to reestablish the synchronization.

In addition, although the oscillation frequency of a VCXO (Voltage-Controlled Crystal Oscillator) generally used as a local oscillator for demodulation can be changed by changing an externally applied control voltage, the precision of the variable frequency function of the VCXO is poor, and the oscillation frequency greatly changes with temperature and time. Therefore, it is technically impossible to uniquely determine the relationship between an input control voltage and an output oscillation frequency. FIG. 2 shows changes in the input/output characteristics of the VCXO in this case.

In the conventional demodulation apparatus shown in FIG. 1, which uses the VCXO having such characteristics as a local oscillator, since the control voltage is changed by the frequency controller 5 while the state of change in local oscillation frequency with temperature and time is left indefinite, the actual frequency sweep range changes.

For this reason, as shown in FIG. 3 the VCXO can be used only when the difference between the minimum necessary sweep range (defined as ±20 kHz) and the maximum allowable sweep range (defined as ±80 kHz) is large. In this case, the minimum necessary sweep range is a range determined by the sum of the frequency shift on the transmission side and the frequency shift in the repeater. The maximum allowable sweep range means the maximum sweep range in which demodulation of a signal from another radio communication system is reliably inhibited.

If, for example, the frequency shift in the transmitter is 5 kHz, and the frequency shift in the repeater is 15 kHz, the minimum necessary sweep range is 5+15=20 kHz. If the frequency spacing is 100 kHz, the maximum allowable sweep range is 100−20=80 kHz.

Assume that the difference between the minimum necessary sweep range and the maximum allowable sweep range is small, as shown in FIG. 4A. In this case, if a VCXO having characteristics A and B, as shown in FIGS. 4B (reference symbol C in FIG. 4B denotes the output control voltage range of the frequency controller 5), the sweep ranges shown in FIG. 4A are respectively set. That is, with the characteristics B, sweep is also performed outside the sweep range, and hence signals other than a target signal may be received.

In addition, in such a conventional frequency sweep control apparatus, the time constant of the LPF 7 is preferably set to be small in the sweep mode of the frequency controller because the frequency is changed stepwise, whereas in the AFC (Auto Frequency Control) mode in which phase synchronization has been established, the time constant is preferably increased to some extent because the BER (Bit Error Rate) of the demodulator is increased with an abrupt change in the oscillation frequency of the variable frequency oscillator. For this reason, in the conventional frequency sweep control apparatus in which the time constant of the LPF 7 is fixed, either the synchronization establishment characteristic or the operation stabilization characteristic must be sacrificed, or both the characteristics must be sacrificed to some extent. Therefore, satisfactory characteristics cannot be obtained.

Furthermore, since the gain of a loop filter in a demodulator generally changes with a change in the C/N (carrier-to-noise) ratio, the lock-in range (the difference between a reception intermediate frequency and the frequency of a variable frequency oscillator) in which the demodulator can demodulate the reception IF signal is dependent on the C/N ratio of the reception IF signal. That is, the range is expanded with an increase in C/N ratio, and vice versa.

In the conventional frequency sweep control apparatus, as shown in FIG. 5, the frequency step width in the sweep mode is fixed to a certain value determined on the basis of the lock-in range in which demodulation can be performed by the demodulator even with a low C/N ratio.

If the frequency step width in the sweep mode is set to be small to enable reception synchronization even with a low C/N ratio, the number of steps required to cause the oscillation frequency of the variable frequency oscillator to fall within the range of allowable frequency differences from the frequency of the reception IF signal is increased. In the sweep mode, every time the oscillation frequency of the variable frequency oscillator is changed, the demodulator must wait for a predetermined period of time to check whether synchronization with the reception IF signal is established. Therefore, the sweep time is prolonged with an increase in the number of steps.

In contrast to this, assume that the frequency step width is set to be optimal when the C/N ratio is high. Note that the C/N ratio is high in a nominal operating state in satellite communications. For example, if the link budget of satellite communications is set to be 99.95% for BER (bit error rate) ≦1.0E-6, the duration of "high C/N ratio" occupies 99% or more of the total operating time. In this case, the difference between the carrier frequency of the reception IF signal and the oscillation frequency of the variable frequency oscillator is always larger than the lock-in range in which the demodulator can demodulate the reception IF signal with a low C/N ratio. For this reason, demodulation may not be performed.

SUMMARY OF THE INVENTION

It is an object of the present invention to provide a frequency sweep control apparatus which can shorten the time interval between the instant at which a unique word signal non-detected state is set and the instant at which a unique word signal detected state is set.

It is another object of the present invention to provide a frequency sweep control apparatus which performs sweep only within a necessary sweep range.

It is still another object of the present invention to provide a frequency sweep control apparatus which can demodulate only a proper reception signal.

It is still another object of the present invention to provide a frequency sweep control apparatus which requires no high-precision frequency measurement unit.

It is still another object to provide a frequency sweep control apparatus which can obtain satisfactory characteristics in both a sweep operation and an AFC operation.

It is still another object of the present invention to provide frequency sweep control apparatus which can shorten the sweep time in a high C/N state and can perform sweep in a low C/N state with a simple arrangement.

In order to achieve the above objects, according to the present invention, there is provided a frequency sweep control apparatus comprising variable frequency oscillation means capable of controlling an oscillation frequency, demodulation means for demodulating a reception intermediate frequency signal by using an output from the variable frequency oscillation means, unique word signal detection means for detecting a unique word signal in the reception signal from a demodulated output from the demodulation means and outputting a detection signal indicating a unique word signal detected state in which the unique word signal is detected or a unique word signal non-detected state in which the unique word signal is not detected, sweep range control means for controlling a sweep range on the basis of an output from the unique word signal detection means, and frequency control means for controlling the oscillation frequency of the variable frequency oscillation means on the basis of an output from the sweep range control means.

BRIEF DESCRIPTION OF THE DRAWINGS

FIG. 10 is a block diagram showing a frequency sweep control apparatus according to the third embodiment of the present invention;

FIG. 15 is a chart showing the relationship between the sweep cycle and the frequency in the apparatus shown in FIG. 14.

DESCRIPTION OF THE PREFERRED EMBODIMENTS

Figure 6:
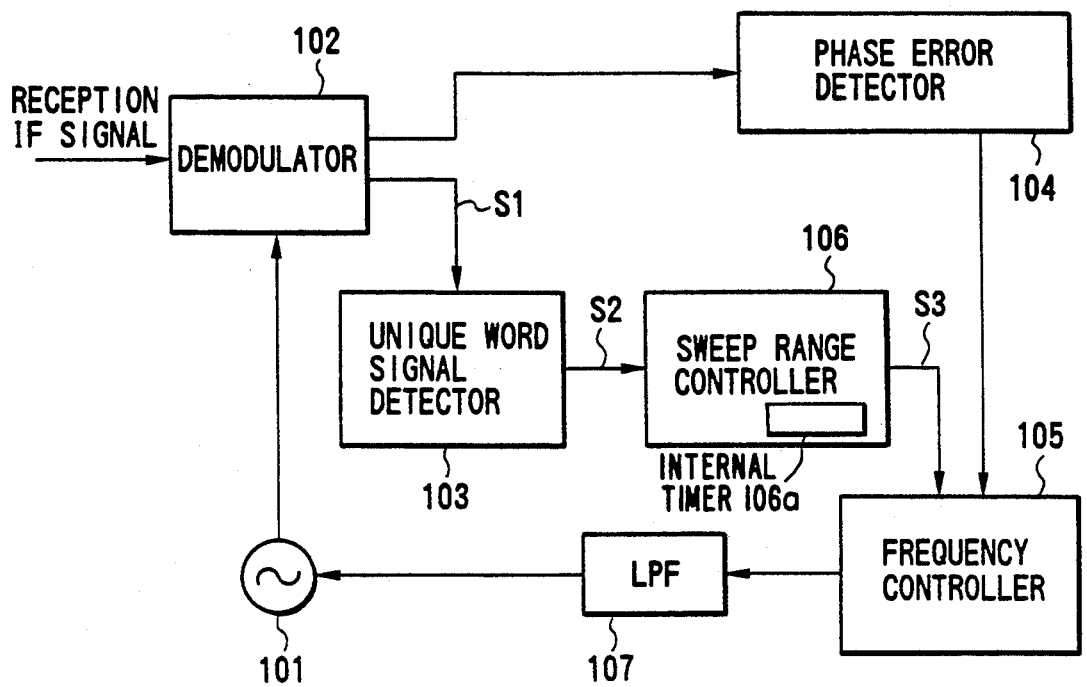
FIG. 6 is a block diagram showing a frequency sweep control apparatus in a demodulation apparatus according to the first embodiment of the present invention.

Embodiments of the present invention will be described in detail below with reference to the accompanying drawings. FIG. 6 shows a frequency sweep control apparatus according to the first embodiment of the present invention.

Referring to FIG. 6, a demodulator 102 receives an output from a variable frequency oscillator 101 and demodulates a reception IF signal as a reception continuous signal. At the same time, the demodulator 102 outputs phase error information, based on the difference between the frequency of the reception IF signal and the oscillation frequency of the variable frequency oscillator 101, to a phase error detector 104. A unique word signal detector 103, to which the reception IF signal as an output from the demodulator 102 is supplied, detects a unique word signal in the reception signal, and supplies the detection output to a sweep range controller 106. Upon reception of the detection output as a trigger signal, the sweep range controller 106 creates information for determining a sweep range, and supplies the information to a frequency controller 105. The frequency controller 105 controls the oscillation frequency of the variable frequency oscillator 101 on the basis of the input sweep range information.

Figure 7:
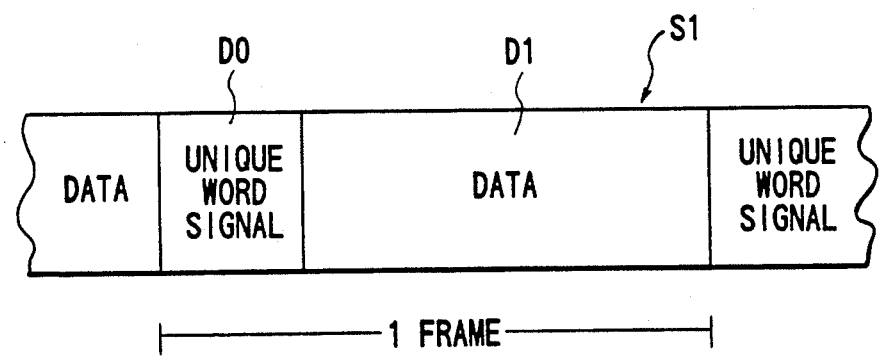
FIG. 7 is a view showing the frame structure of a reception continuous signal.

The variable frequency oscillator 101 is constituted by a voltage-controlled oscillator (VCO) and the like and can change the oscillation frequency in a range wider than the entire required sweep frequency range. The demodulator 102 multiplies the input reception IF signal and the oscillation output from the variable frequency oscillator 101, and outputs a baseband continuous signal S1 through an internal low-pass filter (LPF). This continuous signal S1 has the frame structure shown in FIG. 7. One frame is constituted by a unique word signal D0 and data D1.

The unique word signal detector 103 detects the unique word signal D0 in the continuous signal S1. When the unique word signal D0 is detected, the unique word signal detector 103 outputs a detection signal S2 indicating a synchronous state. Otherwise, the unique word signal detector 103 outputs a detection signal S2 indicating an asynchronous state.

When the detection signal S2 from the unique word signal detector 103 changes from the value indicating the synchronous state to the value indicating the asynchronous state, the sweep range controller 106 starts an internal timer 106a at the timing of this change. The sweep range controller 106 outputs control information S3 designating a narrow band sweep mode, in which only a portion near the reception frequency in the synchronous state is swept, to the frequency controller 105 until a certain period of time elapses. After the certain period of time elapses, the sweep range controller 106 outputs control information S3 designating a wide band sweep mode, in which the entire range is swept, to the frequency controller 105.

Upon reception of the control information S3 from the sweep range controller 106, the frequency controller 105 outputs a frequency control signal corresponding to the sweep range determined by the control information S3 to the variable frequency oscillator 101, thus controlling the oscillation frequency of the variable frequency oscillator 101.

Note that the phase error detector 104 detects a phase error from the phase error information output from the demodulator 102, and that the frequency controller 105 performs an AFC operation on the basis of an output from the phase error detector 104 when a unique word signal is detected.

Since the sweep range can be controlled so as not to sweep an unnecessary frequency range by the sweep range control scheme performed in this manner, the time required to reestablish a synchronous state, when the synchronous state is shifted to an asynchronous state due to a break or the like, can be shortened.

As described above, according to the first embodiment, the narrow band sweep mode, in which sweep is performed near a reception frequency in a synchronous, and the wide band sweep mode, in which the entire range is swept, are switched in accordance with the duration of an asynchronous state with respect to the time point at which the synchronous state changes to the asynchronous state, as a reference time point. Therefore, especially in a case wherein an asynchronous state continues for a short period of time due to a break occurring when the currently used system is switched to a backup system on the transmission side, the synchronization can be immediately reestablished.

With this operation, a good communication state can always be maintained in a radio communication system designed to transmit a continuous signal.

Figure 8:
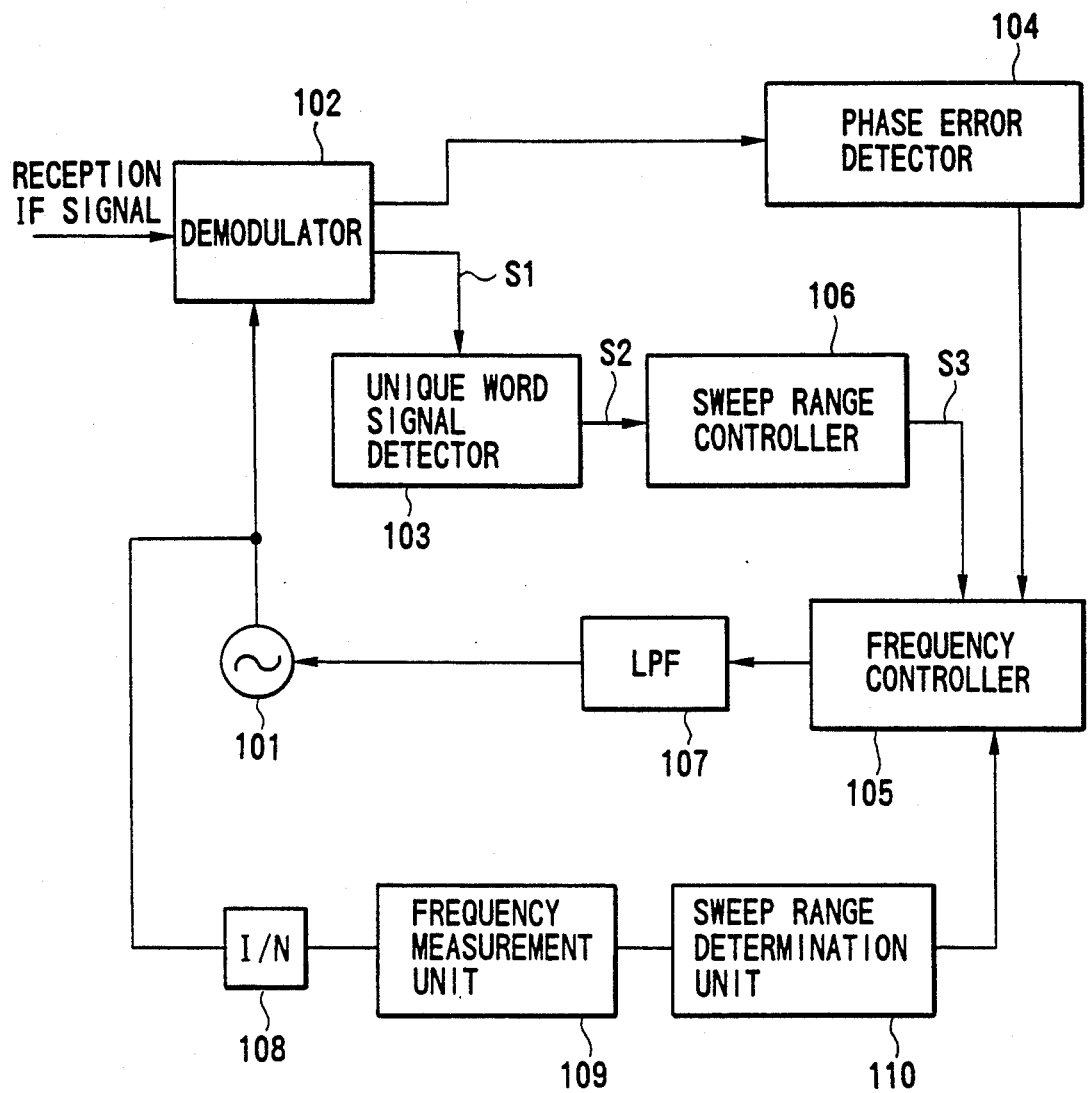
FIG. 8 is a block diagram showing a frequency sweep control apparatus according to the second embodiment of the present invention.

FIG. 8 shows the second embodiment of the present invention. The same reference numerals in FIG. 8 denote the same parts as in FIG. 6. Referring to FIG. 8, in a demodulator 102, a reception IF signal is mixed with a local oscillation signal from a variable frequency oscillator 101 to be demodulated. This demodulated output is input to a unique word signal detector 103 so that whether the reception signal is properly demodulated is determined by detecting a unique word signal. If no unique word signal is detected, the oscillation frequency of the variable frequency oscillator 101 is variably controlled by a frequency controller 105.

For this reason, as the variable frequency oscillator 101, a VCXO whose oscillation frequency can be freely changed by a control voltage, as described above, is used. The oscillation frequency of the VCXO 101 is always monitored and measured by a frequency measurement unit 109 through a frequency divider 108. In this embodiment, a measurement frequency is decreased by the frequency divider 108 for 1/N-dividing an output from the VCXO 101. If, however, the oscillation frequency of the VCXO 101 can be directly measured by the frequency measurement unit 109, the frequency divider 108 can be omitted.

This measurement result is input to a sweep range determination unit 110 to detect whether the oscillation frequency of the VCXO 101 falls within a predetermined sweep range. If it is determined that the measurement result falls outside the sweep range, the determination result is fed back to the frequency controller 105. In response to the determination result, the frequency controller 105 controls a control voltage to cause the oscillation frequency of the VCXO 101 to fall within the sweep range.

Note that a general frequency measurement unit for measuring the oscillation frequency of an oscillator is used as the frequency measurement unit 109. However, this measurement unit is required to have a high frequency precision because it is used for sweep range control. If, for example, a frequency of 100 MHz is to be measured with a precision of 100 Hz, a precision of 100 Hz/100 MHz = 1*10E-6 (1 ppm) is required. The sweep range determination unit 110 compares the measurement result, obtained by the frequency measurement unit 109, with two reference values set for low and high frequencies, respectively. If the frequency measurement result is lower than the lower reference value, the sweep direction is set to increase the frequency. If the measurement result is higher than the higher reference value, the sweep direction is set to decrease the frequency. The two reference values indicate a frequency sweep range, which is uniquely determined in accordance with the application purpose of the apparatus.

Figure 9:
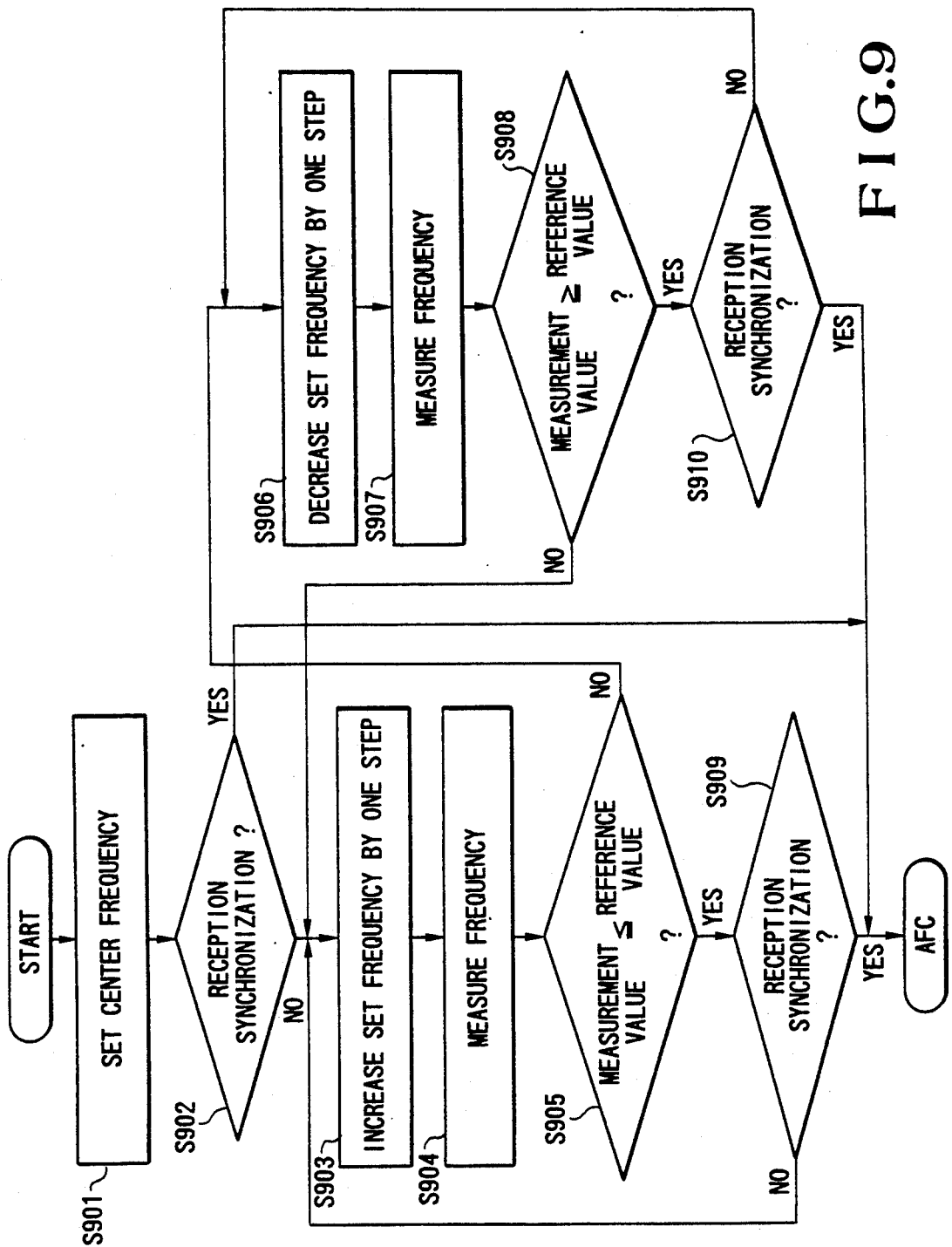
FIG. 9 is a flow chart for explaining a frequency sweep control operation of the apparatus shown in FIG. 8.

FIG. 9 is a flow chart for explaining an operation of the apparatus shown in FIG. 8.

When a set frequency is to be changed in the sweep mode, sweep is started from a position near the center in the sweep range to increase the set frequency (steps S901 to S904). When the set frequency exceeds a predetermined reference value in the sweep range as the frequency is increased (step S905), the sweep direction is switched to decrease the frequency (steps S906 and S907). When the frequency becomes lower than the reference value (step S908), the sweep direction is switched to increase the frequency (steps S903 and S904). By repeating this operation, sweep range control is performed. The operation is repeatedly performed until a reception signal is demodulated, and the unique word signal detector detects a unique word signal (steps S909 and S910).

Note that the step width with which the set frequency is increased/decreased is determined by the lock-in range of the demodulator 102. In practice, waiting times for frequency measurement and reception synchronization determination are to be set in the flow chart shown in FIG. 9.

A center frequency is set first in step S901 in order to reliably set it within the sweep range.

As described above, according to the second embodiment, since sweep control is performed while the oscillation frequency of the VCXO 101 is constantly measured by the frequency measurement unit 109, sweep frequency control can be accurately and finely performed. Even if, therefore, the difference between the minimum necessary sweep range and the maximum allowable sweep range is small, the worst case that a signal from another radio communication system is demodulated can be prevented.

FIG. 10 shows the third embodiment of the present invention, which is obtained by improving the apparatus shown in FIG. 8.

Although the frequency measurement unit 109 in FIG. 8 can accurately set a frequency sweep range, the unit is required to have a high precision. If, for example, a reception IF is 100 MHz, and the sweep range is 50 kHz (inclusive) to 51 kHz (inclusive), 1 kHz, i.e., the difference between 50 kHz and 51 kHz, must be recognized. Since the relationship between 1 kHz and 100 MHz is represented by 1 kHz/100 MHz = 10 ppm, the frequency measurement unit is required to have a measurement precision of 1 ppm, which is about 10 times higher than a precision of 10 ppm.

Under the circumstances, FIG. 10 shows a frequency sweep control apparatus in which the frequency difference between a high-precision frequency oscillator and a variable frequency oscillator is measured, instead of directly measuring the frequency of the variable frequency oscillator, and the measurement value is used as a reference value for frequency control, thereby allowing accurate control of the frequency sweep range of a demodulator even by using a low-frequency, coarse frequency measurement unit.

Referring to FIG. 10, reference numeral 191 denotes a high-precision frequency oscillator having a high frequency precision; and 192, a frequency divider for frequency-dividing an output from the high-precision frequency oscillator 191. A frequency divider 108 serves to divide an output from a variable frequency oscillator 101. A mixer 193 multiplies an output from the frequency divider 108 and an output from the frequency divider 192 together, and outputs the resultant value to an LPF 194. The LPF 194 is a low-pass filter for extracting only a component, from the output from the mixer 193, which corresponds to the difference between the outputs from the frequency dividers 108 and 192. The output from the LPF 194 is supplied to a low-frequency, coarse frequency measurement unit 195 to perform frequency measurement. Reference numeral 110 denotes a sweep range determination unit for determining on the basis of the measurement value obtained by the low-frequency, coarse frequency measurement unit 195 whether the oscillation frequency of the variable frequency oscillator 101 falls within the sweep range. When no unique word signal is detected by a unique word signal detector 103, a frequency controller 105 controls the frequency of the variable frequency oscillator 101 on the basis of the determination result obtained by the sweep range determination unit 110. Note that the dividers 108 and 192 may be inserted only if they are required. The remaining portions of this apparatus are the same as those of the apparatus shown in FIG. 8.

An operation of this embodiment will be described in detail below.

Assume that the oscillation frequency of the variable frequency oscillator 101 is 100 MHz±100 kHz; the oscillation frequency of the frequency controller 105, 100 MHz±10 Hz (precision=1E-7); and the sweep range, 50 kHz (inclusive) to 51 kHz (inclusive) (one side). In this case, if direct measurement is to be performed by a frequency measurement unit, since the difference between 100.050 MHz and 100.051 MHz must be recognized, as described above, the frequency measurement unit is required to have a precision of about 1 ppm. If, however, the frequency difference between the variable frequency oscillator 101 and the high-precision frequency oscillator 191 is to be measured, as in the present invention, a frequency measurement unit is only required to measure a low frequency of about 50 kHz, which is the frequency difference between the two oscillators. In this case, the frequency measurement unit is only required to have a precision within the precision range of accessible quartz crystal oscillators, e.g., 10 Hz/50 kHz=200 ppm, even though measurement is performed with a precision equal or close to the precision of the high-precision frequency oscillator 191. Considering a quartz crystal oscillator with the poorest precision, of the accessible quartz crystal oscillators, has a precision of ±100 ppm, the precision, 200 ppm, can be easily achieved.

According to the frequency sweep control apparatus of this embodiment, therefore, instead of directly measuring the frequency of the variable frequency oscillator 101 by using a high-precision frequency measurement unit, the frequency difference between the variable frequency oscillator 101 and the high-precision frequency oscillator 191 is measured by using the frequency dividers 108 and 192, as needed. Even if, therefore, measurement is performed by the low-frequency, coarse frequency measurement unit 195, the measurement precision can be increased to a value equal or close to the precision of the high-precision frequency oscillator 191. By using this high-precision measurement result for sweep range control, high-precision sweep range control can be performed. Therefore, frequency sweep can be satisfactorily performed by using the variable frequency oscillator 101 such as a VCXO whose oscillation frequency greatly changes with temperature and time, without using a special frequency measurement unit. That is, frequency measurement can be satisfactorily performed by a low-frequency, coarse frequency measurement unit.

Note that the frequency controller 105 controls the frequency of the oscillator in the demodulator and operates in both the sweep mode and the AFC mode. In the sweep mode, the oscillation frequency is changed stepwise. In the AFC mode, the oscillation frequency is continuously changed. Switching of the sweep directions in a sweep state is dependent on an output from the sweep range determination unit. When switching of the sweep directions is to be performed, the magnitude of the currently set frequency is considered, in addition to an output from the sweep determination unit which indicates whether the sweep direction needs to be changed.

As the low-frequency, coarse frequency measurement unit 195, a low-frequency, coarse measurement unit may be used, because the unit 195 is only required to measure the frequency difference between an oscillator and another oscillator having a high precision. If, for example, the frequency difference is 100 kHz, and measurement is to be performed with a precision of 100 Hz, the measurement precision may be 100/100k=1*10E-3 (1,000 ppm). In addition, the measurement frequency may be set to be as low as 100 kHz compared with 100 MHz for the measurement unit described above.

The actual hardware of this measurement unit is realized by using the input port of a one-chip CPU and a timer counter. A frequency difference signal is converted into a rectangular wave and is input to the port. In the CPU, the time interval between the rising edges of this input is measured by the timer counter. When the interval is long, the frequency is low, and vice versa. If the interval exceeds a reference value by 30%, frequency measurement is stopped, while the sweep direction remains the same. The frequency measurement is stopped because it is determined, on the basis of the fact that the interval exceeds the reference value, that the frequency is lower than the reference value. This time measurement (frequency measurement) precision is lower than the operating clock precision (±100 ppm) of the CPU. However, the above-mentioned measurement precision requirement, i.e., 1,000 ppm, can be satisfied.

The sweep range determination unit 110 compares the measurement result obtained by the low-frequency, coarse frequency measurement unit 195 with a reference value. One reference value is set. If the frequency measurement result is higher than this reference value, the necessity of changing the sweep direction is informed to the frequency controller 105. The reference value indicates a frequency sweep range, which is uniquely determined by the application purpose of the apparatus.

Figure 11:
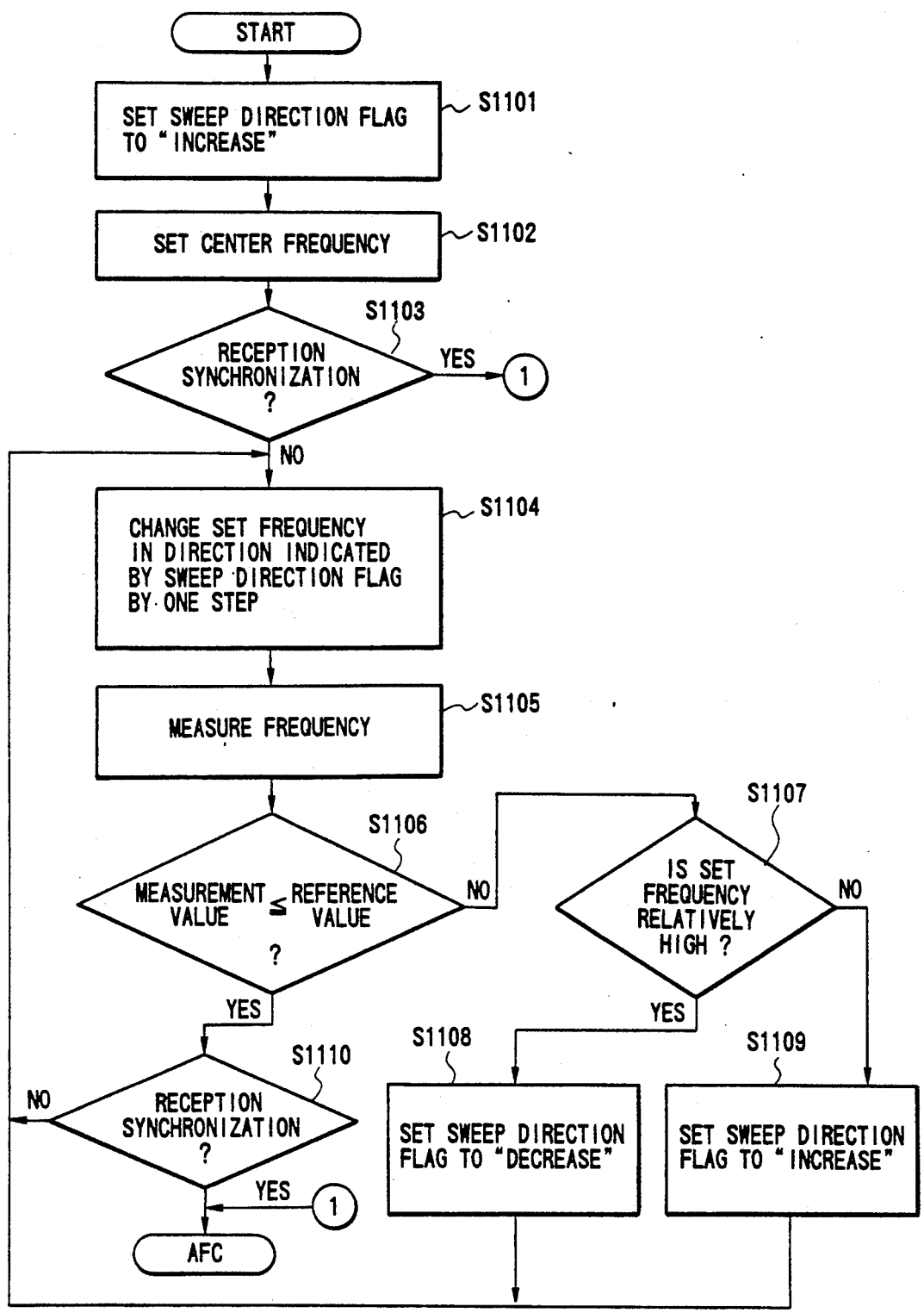
FIG. 11 is a flow chart for explaining a frequency sweep control operation of the apparatus shown in FIG. 10.

FIG. 11 is a flow chart for explaining a sweep control operation of the apparatus shown in FIG. 10.

When a set frequency is to be changed in the sweep mode, sweep is started from a position near the center in the sweep range to increase the set frequency (steps S1101 to S1105). When the set frequency exceeds a predetermined reference value in the sweep range as the frequency is increased, the sweep direction is switched (step S1106). At this time, it is confirmed that the set frequency is relatively high (step S1107), and the sweep direction is changed to decrease the frequency (step S1108). If the set frequency exceeds the reference value in the sweep range as the frequency is decreased, the sweep direction is switched (steps S1104 to S1107). At this time, it is confirmed that the set frequency is relatively low, and the sweep direction is changed to increase the frequency (step S1109). On the other hand, while the measurement value remains below the reference value, frequency measurement in one direction is repeated (steps S1104 to S1110). If reception synchronization is established, the AFC mode is set (step S1110).

The sweep range determination unit 110 considers the set frequency when the sweep direction is switched, in order to prevent the deadlock that switching of the sweep directions is only repeated outside the sweep range, but the frequency of the oscillator does not fall within the sweep range.

Note that the IF statement "IS SET FREQUENCY RELATIVELY HIGH" in step S1107 is made to determine whether the frequency exceeding the reference value is relatively high or low in the sweep range. If only a sweep direction switching operation is performed without this determination, it may cause the deadlock that switching of the sweep directions is continuously performed outside the sweep range, and that leading the oscillation frequency does not fall within the sweep range.

Figure 12:
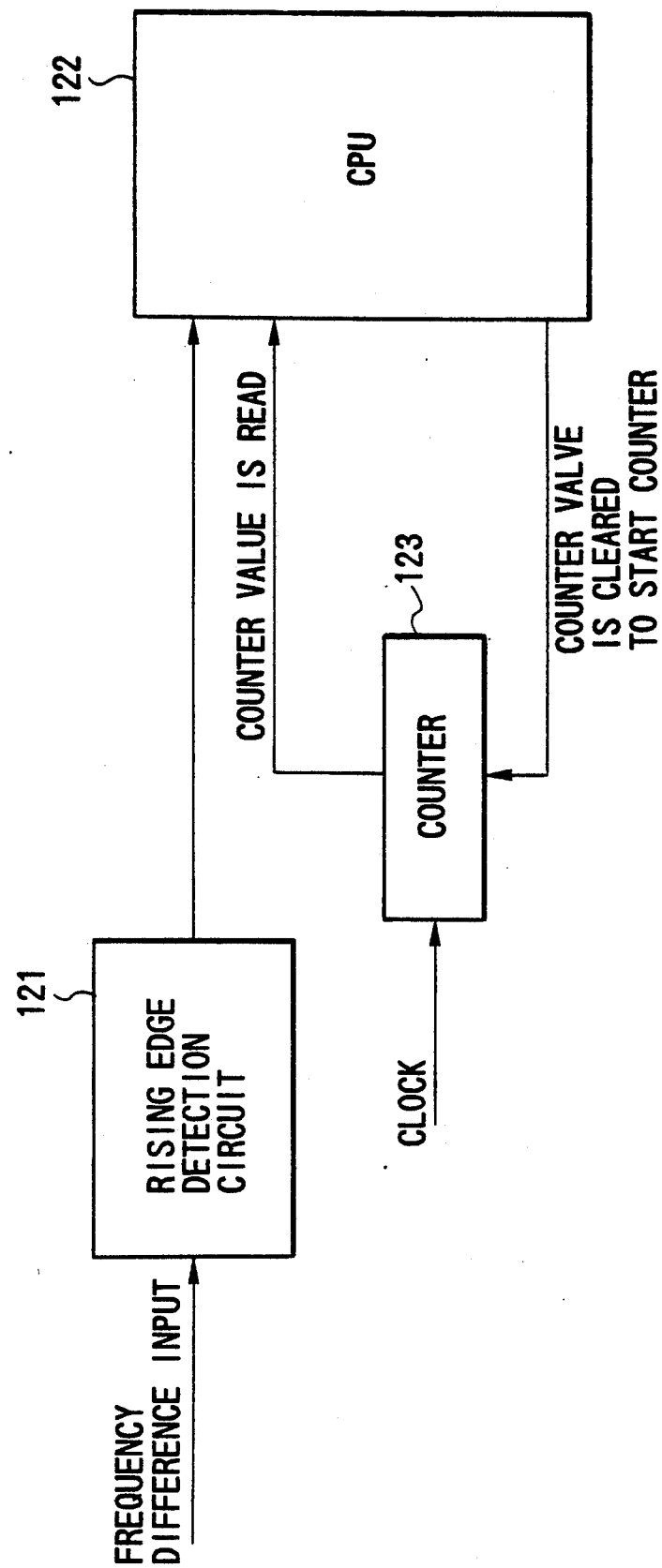
FIG. 12 is a block diagram showing a low-frequency, coarse frequency measurement unit in FIG. 10.

FIG. 12 shows the detailed arrangement of the low-frequency, coarse frequency measurement unit 195, which comprises a detection circuit 121 for receiving a frequency difference signal and detecting its rising edge, a CPU 122 for receiving the detection output from the rising edge detection circuit 121, and a counter 123 which is cleared and started by the CPU 122 and outputs a counter value to the CPU 122.

Figure 13:
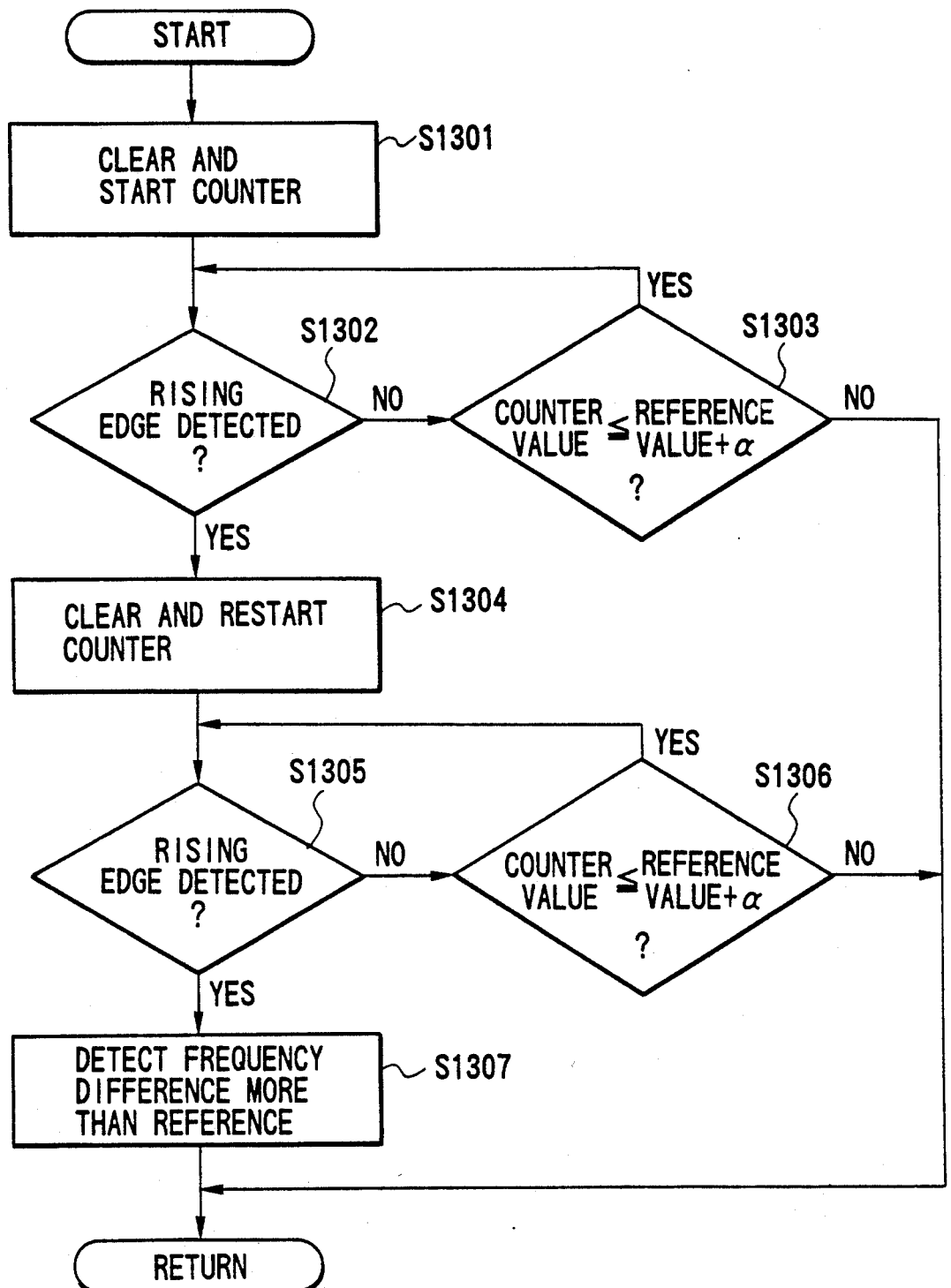
FIG. 13 is a flow chart for explaining the measurement unit shown in FIG. 12.

FIG. 13 is a flow chart showing an operation of the measurement unit shown in FIG. 12, which flow chart corresponds to "PERFORM FREQUENCY MEASUREMENT" in step S1105 in FIG. 11.

Assume that a frequency of 10 kHz is to be detected, and that clocks are input to the counter 123 at a period of 4.0 $\mu$s (by means of hardware). In this case, since the period is 100 $\mu$s when the frequency is 10 kHz, a reference value to be compared with the counter value can be set to be $100 \div 4 = 25$.

The counter 123 is cleared and started first, and the CPU 122 waits for the detection of a rising edge (steps S1301 and S1302). If the counter value exceeds 25 before rising edge detection, the rising edge interval of the input exceeds the reference value. That is, the frequency is lower than the reference value. Since it is determined that the frequency falls within the sweep range, frequency measurement is completed (step S1303). If a rising edge is detected, the counter 123 is cleared and started again (step S1304). If the counter value exceeds the reference value before rising edge detection, frequency measurement is completed (steps S1305 and S1306) as with the case described above. If a rising edge is detected, the counter value is read to detect a frequency (step S1307). More specifically, a frequency is measured as follows. If the counter value is 25, the interval is 100 $\mu$s = 10 kHz. If the counter value is 24, the interval is 96 $\mu$s = 10.42 kHz. In this manner, sweep range determination can be performed with a measurement precision of 420 Hz.

As described above, according to the third embodiment, instead of directly measuring the oscillation frequency of the variable frequency oscillator by using the frequency measurement unit, only the frequency difference between the variable frequency oscillator and the high-precision frequency oscillator is measured by the frequency measurement unit. Even if, therefore, the measurement precision of the frequency measurement unit is poor, frequency measurement can be preformed with a measurement precision equal or close to the precision of the high-precision frequency oscillator. Accurate frequency sweep range control can be performed by using this measurement result.

Figure 14:
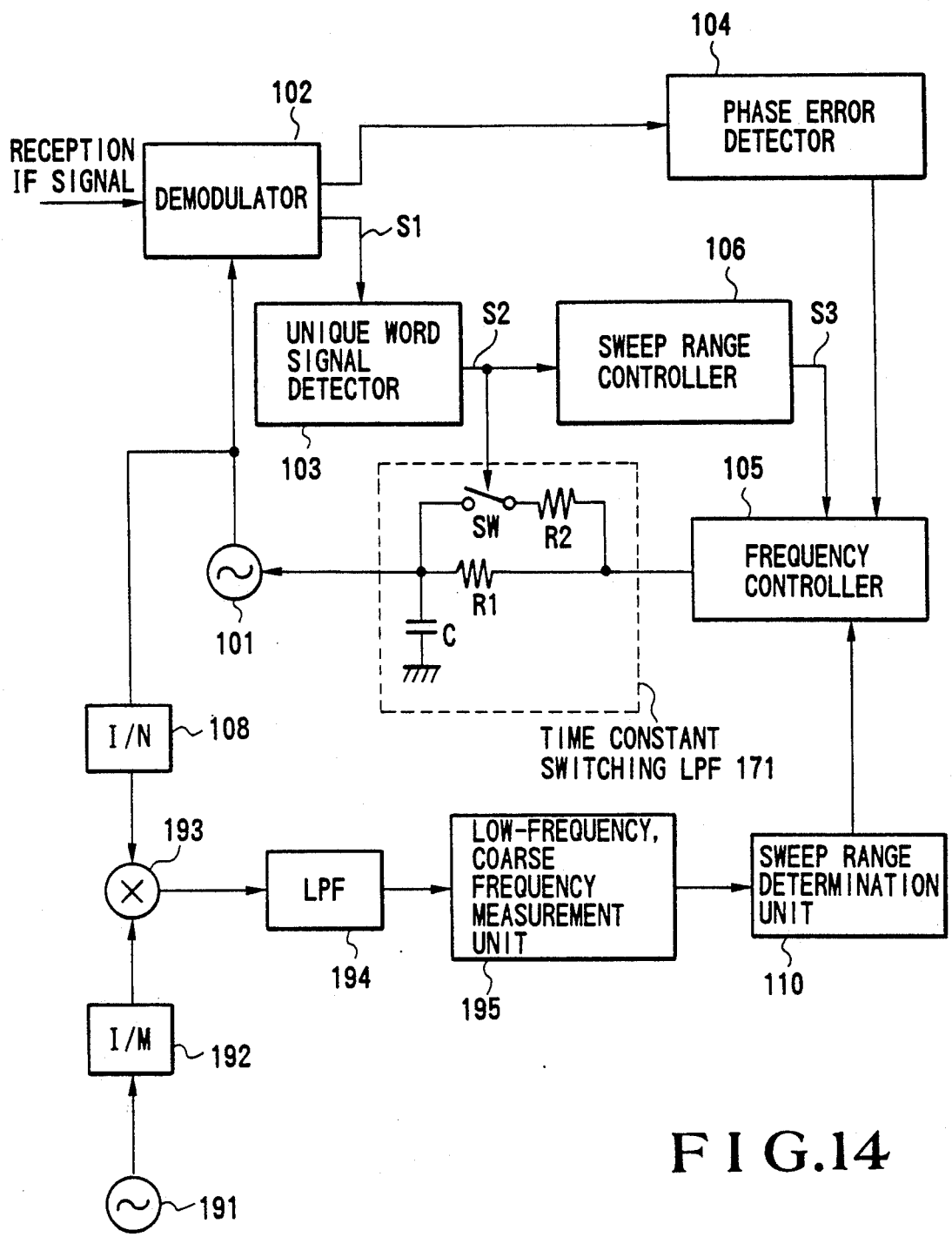
FIG. 14 is a block diagram showing a frequency sweep control apparatus according to the fourth embodiment of the present invention.

FIG. 14 shows the fourth embodiment of the present invention. Referring to FIG. 10, a frequency sweep control apparatus of this embodiment includes a time constant switching LPF 171 in place of the LPF 107 in the apparatus shown in FIG. 10.

In the fourth embodiment, a unique word signal detector 103 detects a unique word signal in a reception signal output from a demodulator 102. When this unique word signal is detected, the unique word signal detector 103 outputs a signal indicating a synchronous state. Otherwise, the unique word signal detector 103 outputs a signal indicating an asynchronous state. A phase error detector 104 detects a phase error from phase error information output from the demodulator 102, and outputs frequency control direction information for an AFC operation.

A frequency controller 105 controls the oscillation frequency of a variable frequency oscillator 101 on the basis of the outputs from the unique word signal detector 103 and the phase error detector 104. More specifically, when the unique word signal detector 103 detects no unique word signal, the frequency controller 105 performs a sweep operation to change the oscillation frequency of the variable frequency oscillator 101 stepwise. Otherwise, the frequency controller 105 performs an AFC operation on the basis of the output from the phase error detector 104.

In this case, the stepwise change of the oscillation frequency of the variable frequency oscillator 101 in the sweep mode is large in amount, whereas the oscillation frequency is changed finely in the AFC mode. If, however, frequency control is to be performed by using a digital demodulator, since a DAC (Digital-to-Analog Converter) is used for the frequency controller 105, the following problem is posed in the AFC mode, although no problem is posed when the frequency is to be changed stepwise. Even in the AFC mode, which is designed to continuously change the oscillation frequency, the frequency is changed stepwise (although the change amount per step is small). This stepwise change must be prevented because it causes an increase in BER. Therefore, the LPF 171 is inserted in a control line through which the frequency controller 105 controls the variable frequency oscillator 101.

In the fourth embodiment, the time constant switching LPF 171 is used as an LPF inserted in the control signal line of the frequency controller 105. The time constant switching LPF 171 is designed such that a resistor R2 is selectively connected to an LPF, constituted by a resistor R1 and a capacitor C, through a switch SW, which is switched by an output from the unique word signal detector 103, thereby changing the time constant. In this case, the time constant is set to be large in a synchronous state, and small in an asynchronous state on the basis of an output from the unique word signal detector 103.

In the sweep mode, therefore, the time constant is set to be small to allow the frequency to easily change with a certain step width. In a synchronous state, the time constant is set to be large to suppress variations in frequency, thus preventing a degradation in BER characteristics. With this operation, the two contradictory characteristics in the conventional apparatus can be satisfied at the same time.

In the above embodiment, the time constant switching LPF 171 has an RC structure. However, even if the LPF is constituted by active elements, the same effects as described above can be obtained.

As described above, according to the fourth embodiment, the time constant of the LPF inserted in the signal line for controlling the oscillation frequency of the variable frequency oscillator can be changed depending on whether the sweep mode or the AFC mode is set. Therefore, in the sweep mode, the frequency can be changed stepwise, whereas in the AFC mode, the frequency can be continuously and gradually changed. With this operation, synchronization can be quickly established, and the operation of the apparatus can be stabilized.

In the apparatus shown in FIG. 14, the frequency controller 105 is designed to change the oscillation frequency of the variable frequency oscillator 101 with a predetermined frequency step width. The change in oscillation frequency is carried out within a predetermined frequency range.

The frequency controller 105 first sets the variable frequency oscillator 101 to one edge of the frequency band of the predetermined frequency range. Then the frequency controller 104 starts to set and re-set the variable frequency oscillator 101, with the predetermined frequency range, with the oscillator frequency changing by a predetermined frequency step width. When the set frequency reaches the other edge of the frequency band of the predetermined frequency range, the first sweep cycle is completed, and then the second sweep cycle will start.

The starting frequency of the second sweep cycle is different from the starting frequency of the first sweep cycle. The frequency difference between the starting frequency of the first sweep cycle and the starting of the second sweep cycle is an incremental change which is less than the predetermined frequency step width. The recommended difference is one-half of the predetermined frequency step width.

The second seep cycle is controlled by the frequency controller 105 in the same manner that the first sweep cycle was controlled with the same predetermined frequency width until a set frequency reaches the edge of the band of the predetermined frequency range.

FIG. 15 illustrates these two cycles in the first and second rows. In FIG. 15, the difference between the starting frequencies of the first and second sweep cycles is one half of the predetermined frequency step width. In this figure, all frequencies set or re-set in the first or second seep cycle are different from each other by the same amount. The set frequencies for the third and fourth sweep cycles are the same as described above. That is, a starting frequency of the third sweep cycle is in the middle as compared to the starting frequency of the first and second sweep cycles. Likewise, the starting frequency of the fourth sweep cycle is a half of the predetermined frequency step width of the third sweep cycle.

FIG. 15 illustrates the set frequencies by arrows at each sweep cycle of the first through fourth sweep cycles on the first through fourth rows and also illustrates, the bottom row collates the combined first set frequencies for all of the first through fourth sweep cycles. A review of the bottom row in FIG. 15 shows how closely the complete scan covers the entire band width. The merit of this apparatus is based on the fact that a lock-in range of a demodulator varies depending on a C/N (carrier-to-noise) ratio of the reception signal. A lock-in range of a high C/N ratio state is wide and of a low C/N ratio state is narrow. FIG. 15 illustrates this relationship. A demodulator should capture a desired reception signal even in a low C/N ratio state, so that the frequency step width in a conventional apparatus is set to the lock-in range in a low C/N state.

Figure 1:
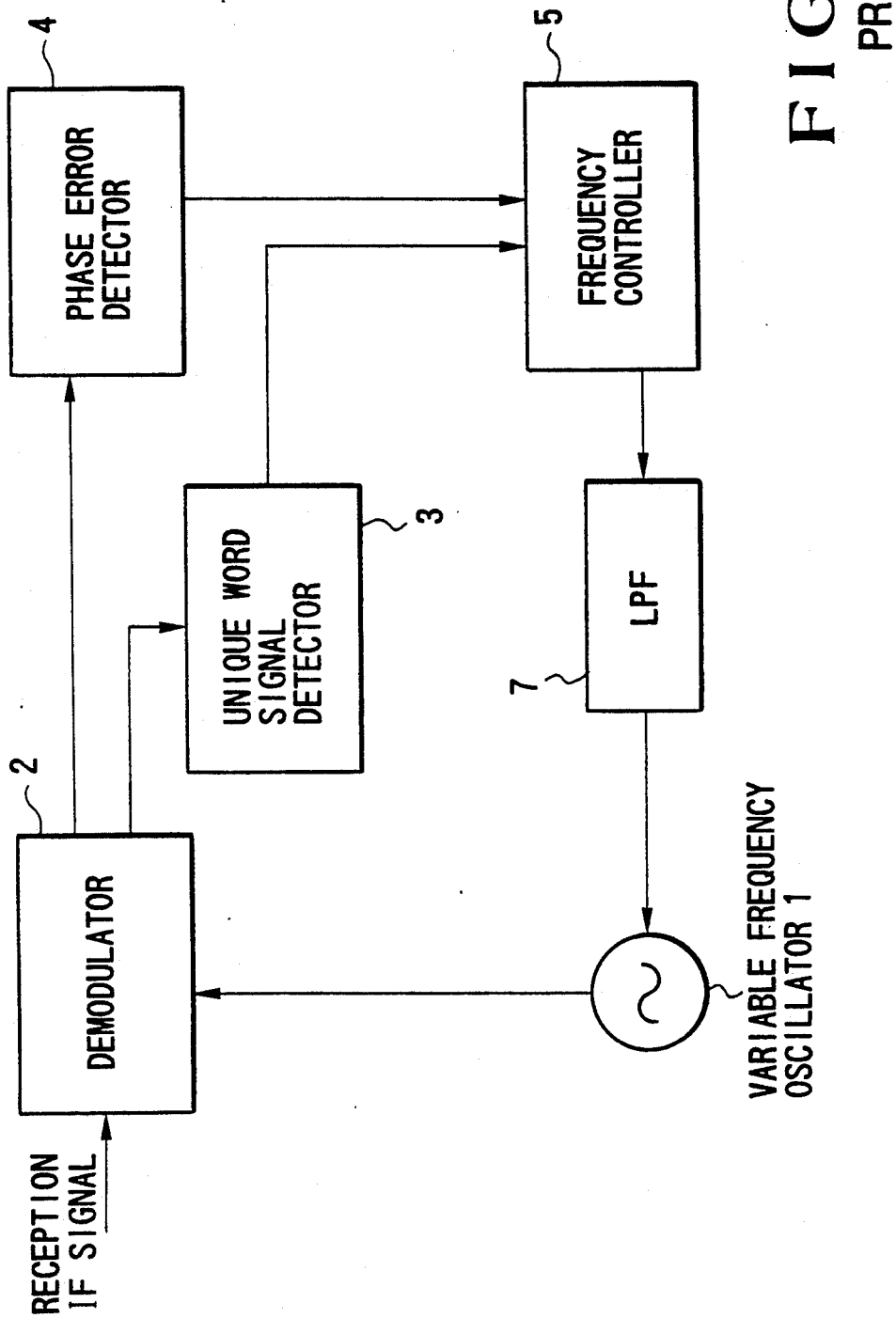
FIG. 1 is a block diagram showing a frequency sweep control apparatus in a conventional demodulation apparatus.
Figure 2:
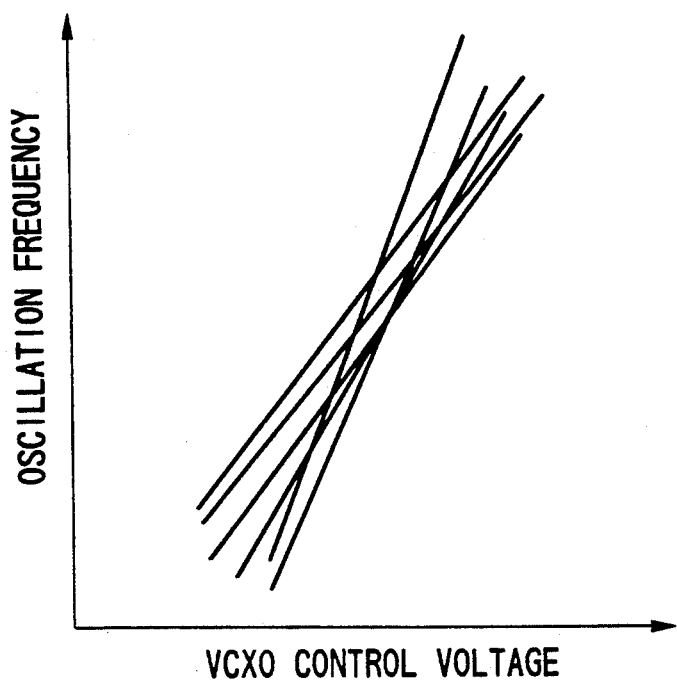
FIG. 2 is a graph showing the relationship between the control voltage applied to a VCXO and the oscillation frequency.
Figure 3:
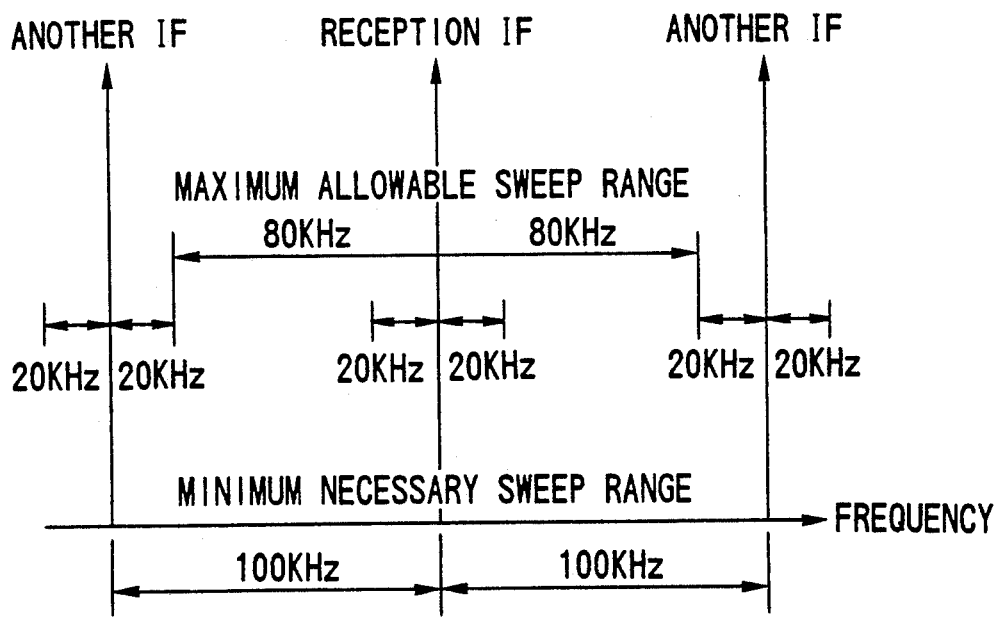
FIG. 3 is a chart showing the relationship between the minimum necessary sweep range and the maximum allowable sweep range in the conventional frequency sweep control apparatus.
Figure 4A:
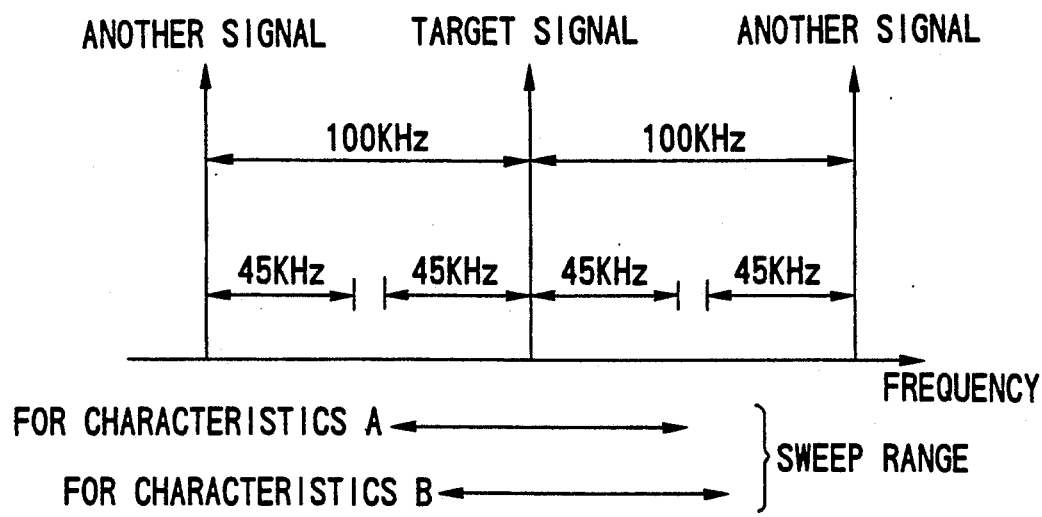
FIG. 4A is a chart showing the relationship between the characteristics of the VCXO and the sweep ranges.
Figure 4B:
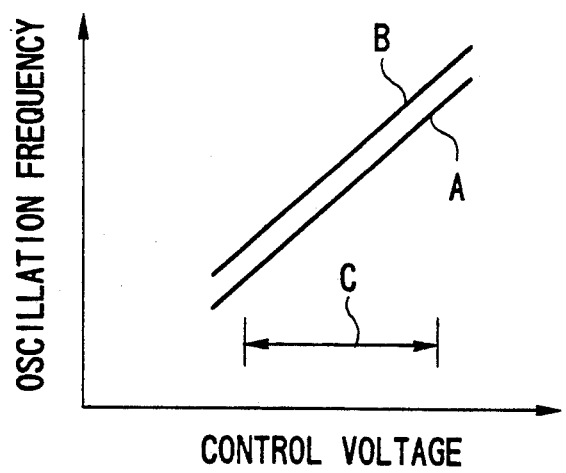
FIG. 4B is a graph showing examples of characteristics of the VCXO.
Figure 5:
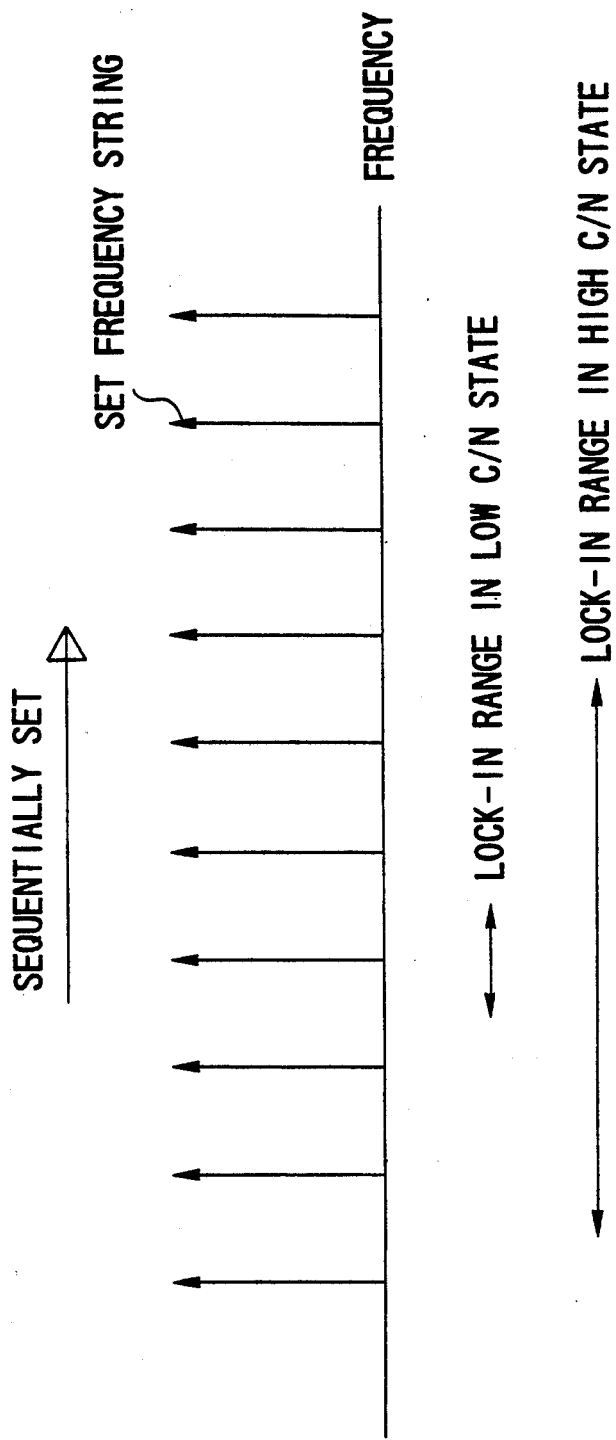
FIG. 5 is a chart showing the relationship between the step width and the lock-in range in the conventional frequency sweep control apparatus and also showing the lock-in range difference between in a low C/N (Carrier-to-Noise) state and in a high C/N state.

The set frequencies in a conventional apparatus is illustrated by the arrows in FIG. 5. The width between the arrows is the same with respect to the lock-in range in a low C/N ration state. As a result, many set frequencies are required. It takes much more time to establish synchronization even in a high C/N ratio state, or in a wide lock-in range state.

FIG. 15 shows one more point relating to the values of the predetermined frequency step width and the frequency step width between the set frequencies during the first through fourth sweep cycles. The predetermined frequency step width is a frequency width corresponding to a lock-in range at a high carrier-to-nose power density ration state of a reception signal. The step width of all set frequencies of the first through fourth sweep cycles is set to a frequency step width corresponding to a lock-in range at a low carrier-to-nose power density ration state of a reception signal.

According to this scheme, therefore, when the C/N ratio of a reception IF signal is high, synchronization can be satisfactorily established by performing sweep with the frequency step width set by the frequency controller 105. As a result, the time taken for one sweep cycle is shortened, and hence the time required to establish synchronization can be shortened. In addition, by performing sweep a plurality of number of times while finely changing the set frequency from a set frequency in a previous sweep cycle, a sweep operation with a small frequency step width can be equivalently performed as a whole, as indicated by the illustration at a lower position in FIG. 15. Therefore, even if the C/N ratio of the reception IF signal is low, and the lock-in range is narrow, synchronization can be reliably established.

That is, the sweep time in a high C/N state, or wide lock-in range state, can be shortened, while synchronization in a low C/N state, or a lock-in range state, can be established. In addition, since there are no required units for measuring a C/N ratio, a reception power or the like, nor a unit for controlling a frequency setting operation the circuit arrangement of the apparatus can be simplified.

In the above embodiment, one frequency step cycle is completed upon four sweep cycles. If, however, a more smaller step width is required, the width of frequency change between the respective sweep cycles may be decreased, and one frequency step cycle may be completed upon a larger number of sweep cycles. With this setting, synchronization in a lower C/N state can be established.

What is claimed is:

1. A frequency sweep control apparatus comprising:
  variable frequency oscillation means for generating an oscillation frequency;
  demodulation means for demodulating a reception intermediate frequency signal by using an output from said variable frequency oscillation means;
  unique word signal detection means for detecting a unique word signal in the reception signal from a demodulated output from said demodulation means and outputting a detection signal indicating a unique word signal detected state in which the unique word signal is detected or a unique word signal non-detected state in which the unique word signal is not detected;

sweep range control means for outputting a sweep range control information in accordance with the duration of the unique word signal detected state as detected by said unique word signal detection means;
frequency control means for causing said variable frequency oscillation means to oscillate within a sweep range of the oscillation frequency designated by the sweep range control information; and
timer means for measuring a duration of the unique word signal non-detected state with respect to a time point where the unique word signal detected state change to the unique word signal non-detected state,
wherein said sweep range control means controls said frequency control means such that only a frequency range near a frequency set in an immediately preceding unique word signal detected state is set as said sweep range in order to shorten a time for detecting the unique word signal until a measuring result by said timer means comes to a predetermined period of time, and an entire frequency range is set as said sweep range after the measuring result by said timer means comes to the predetermined period of time.

2. A frequency sweep control apparatus comprising:
variable frequency oscillation means for generating an oscillation frequency;
demodulation means for demodulating a reception intermediate frequency signal by using an output from said variable frequency oscillation means;
unique word signal detection means for detecting a unique word signal in the reception signal from a demodulated output from said demodulation means and outputting a detection signal indicating a unique word signal detected state in which the unique word signal is detected or a unique word signal non-detected state in which the unique word signal is not detected;
sweep range control means for outputting a sweep range control information in accordance with the duration of the unique word signal detected state as detected by said unique word signal detection means;
frequency control means for causing said variable frequency oscillation means to oscillate within a sweep range of the oscillation frequency designated by the sweep range control information;
frequency measurement means for measuring the oscillation frequency of said variable frequency oscillation means; and
frequency determination means for determining whether the measured oscillation frequency falls within said sweep range, and controlling said frequency control means to cause the oscillation frequency to fall within the range if the oscillation frequency falls outside the range.

3. A frequency sweep control apparatus comprising:
variable frequency oscillation means for generating an oscillation frequency;
demodulation means for demodulating a reception intermediate frequency signal by using an output from said variable frequency oscillation means;
unique word signal detection means for detecting a unique word signal in the reception signal from a demodulated output from said demodulation means and outputting a detection signal indicating a unique word signal detected state in which the unique word signal is detected or a unique word signal non-detected state in which the unique word signal is not detected;
sweep range control means for outputting a sweep range control information in accordance with the duration of the unique word signal detected state as detected by said unique word signal detection means;
frequency control means for causing said variable frequency oscillation means to oscillate within a sweep range of the oscillation frequency designated by the sweep range control information;
high-precision frequency oscillation means having an oscillation frequency closed to the oscillation frequency of said variable frequency oscillator means;
mixer means for mixing the oscillation output from said variable frequency oscillation means with an oscillation output from said high-precision frequency oscillation means and outputting a frequency difference signal;
low-pass filter means for extracting the frequency difference signal;
low-frequency, coarse frequency measurement means for measuring an output frequency from said low-pass filter means; and
frequency determination means for determining whether a measurement value obtained by said frequency measurement means falls within said sweep range, and controlling said frequency control means to cause the measurement value to fall within the range if the measurement value falls outside the range.

4. A frequency sweep control apparatus comprising:
variable frequency oscillation means for generating an oscillation frequency;
demodulation means for demodulating a reception intermediate frequency signal by using an output from said variable frequency oscillation means;
unique word signal detection means for detecting a unique word signal in the reception signal from a demodulated output from said demodulation means and outputting a detection signal indicating a unique word signal detected state in which the unique word signal is detected or a unique word signal non-detected state in which the unique word signal is not detected;
frequency control means for controlling the oscillation frequency of said variable frequency oscillation means on the basis of an output from said unique word signal detection means; and
low-pass filter means inserted in a control line extending from said frequency control means to said variable frequency oscillation means and having a time constant which is subjected to a switching control in accordance with an output from said unique word signal detection means, said low-pass filter means being controlled such that the time constant is switched to a small value when said unique word signal detecting means detects no synchronous state, and being switched to a large value when said unique word signal detection means a synchronous state.

5. A frequency sweep control apparatus comprising:
variable frequency oscillation means for generating an oscillation frequency;
demodulation means for demodulating a reception intermediate frequency signal by using an output from said variable frequency oscillation means;

unique word signal detection means for detecting a unique word signal in the reception signal from a demodulated output from said demodulation means and outputting a detection signal indicating a unique word signal detected state in which the unique word signal is detected or a unique word signal non-detected state in which the unique word signal is not detected; and sweep range control means for outputting a sweep range control information in accordance with the duration of the unique word signal detected state as detected by said unique word signal detection means;

frequency control means for causing said variable frequency oscillation means to oscillate within a sweep range of the oscillation frequency designated by the sweep range control information;

said frequency control means for controlling the oscillation frequency of said variable frequency oscillation means such that a start frequency in each sweep cycle is changeable and a predetermined frequency step width in said each sweep cycle is the same, so that a sweep time is shortened, when the detection signal obtained by said unique word signal detecting means indicates said unique word signal non-detected state.

6. An apparatus according to claim 2, further comprising frequency dividing means for frequency-dividing the oscillation output from said variable frequency oscillation means, and wherein said frequency measurement means measures an output from said frequency dividing means.

7. An apparatus according to claim 3, further comprising first frequency dividing means for frequency-dividing the oscillation output from said variable frequency oscillation means and outputting the resultant value to said mixer means, and second frequency dividing means for frequency-dividing the output from said high-precision frequency oscillation means and outputting the resultant value to said mixer means, and wherein said mixer means mixes the outputs from said first and second frequency dividing means and outputs the frequency difference signal.

8. An apparatus according to claim 3, wherein if the oscillation frequency of said variable frequency oscillation means in the sweep range is $f1 \pm \Delta f$, and the oscillation frequency of said high-precision frequency oscillation means is $f2$, a measurement precision of said frequency measurement means for measuring a frequency difference between $f1 \pm \Delta f$ and $f2$ is set to be higher than a precision of 200 ppm with respect to $\Delta f$.

9. An apparatus according to claim 1, further comprising low-pass filter means inserted in a control line extending from said frequency control means to said variable frequency oscillation means and having a time constant which is subjected to switching control in accordance with an output from said unique word signal detection means, said low-pass filter means being controlled such that the time constant is switched to a small value when said unique word signal detection means detects no synchronous state, and being switched to a large value when said unique word signal detection means detects a synchronous state.

10. An apparatus according to claim 5, wherein the predetermined frequency step width is set to be a first frequency step width corresponding to a first lock-in range at a high carrier-to-noise power density ratio state of said reception signal, and a changing width of the start frequency in said each sweep cycle is set to be a second frequency step width corresponding to a second lock-in range at a low carrier-to-nose power density ratio state of the reception signal.

11. An apparatus according to claim 1, further comprising phase error detection means for detecting a phase error from input phase error information and outputting frequency control direction information for auto frequency control, and wherein said demodulation means outputs the phase error information on the basis of a frequency in the reception intermediate frequency signal and the oscillation frequency of said variable frequency oscillation means, and said frequency control means performs the auto frequency control on the basis of the frequency control direct information when the output from said unique word signal detection means indicates said unique word signal detected state.

12. An apparatus according to claim 1, wherein said variable frequency oscillation means comprises a voltage-controlled oscillator.

* * * * *